United States Patent [19]
Meyer et al.

[11] Patent Number: 4,999,580
[45] Date of Patent: Mar. 12, 1991

[54] MAGNETIC RESONANCE IMAGING AND SPECTROSCOPY USING A SINGLE EXCITATION PULSE FOR SIMULTANEOUS SPATIAL AND SPECTRAL SELECTIVITY

[75] Inventors: Craig H. Meyer; John M. Pauly, both of Menlo Park, Calif.

[73] Assignee: The Board of Trustees of the Leland Stanford Junior University, Stanford, Calif.

[21] Appl. No.: 368,765

[22] Filed: Jun. 20, 1989

[51] Int. Cl.$^5$ .................... G01R 33/28; G01R 33/44
[52] U.S. Cl. ................................................ 324/309
[58] Field of Search ................... 324/307, 309, 311; 128/653 A; 364/413.13

[56] References Cited

U.S. PATENT DOCUMENTS

| | | | |
|---|---|---|---|
| 4,794,337 | 12/1988 | Twieg | 324/309 |
| 4,812,760 | 3/1989 | Bottomley et al. | 324/309 |
| 4,843,549 | 6/1989 | McKinnon | 324/309 |
| 4,847,559 | 7/1989 | Keren | 324/309 |

OTHER PUBLICATIONS

Meyer et al., "Selective Excitation for Fast Imaging", 2nd European Congress of NMR in Medicine and Biology, Berling, Jun. 23-26, 1988.
Meyer et al., ". . . Spatial and Spectral Selective . . . ", 7th Annual Meeting SMRM, San Francisco, CA., Aug. 20-26, 1988.
Pauly et al., ". . . K-Space Analysis . . . ", J. of Magnetic Resonance, vol. 81, pp. 43-56, 1989.
Joseph, ". . . Chemical Shift MR Imaging . . . ", J. of Computer Assisted Tomography, vol. 9, No. 4, Jul.-/Aug., 1985.
Dumoulin, ". . . Chemical-Shift14 Selective Imaging", Magnetic Resonance in Medicine 2, pp. 583-585, 1985.
Volk et al., "Chemical Shift-Specific Slice Selection . . . ", J. of Magn. Res. 71, pp. 68-174, 1987.
Park et al., "Gradient Reversal Technique . . . ", Magn. Res. in Med. 4, pp. 526-536, 1987.
Brown et al., "NMR Chemical Shift . . . ", Proc. Natl. Acad. Sci., U.S.A., vol. 79, pp. 3523-3526, Jun., 1982.
Ljunggren, ". . . Fourier-Based Imaging Method", J. of Magn. Res. 54, 338-343, 1983.
Twieg, ". . . K-Trajectory . . . ", Med. Phys. 10(5), Sep./Oct., 1983.
Haase et al., "Flash Imaging . . . ", J. of Magn. Res. 67, pp. 258-266, 1986.
Wehrli, ". . . Fast Scan magnetic Resonance", General Electric Medical Systems, 1985.
Shenberg, ". . . Time Varying Gradients", Dissertation, Dept. of Electrical Engineering, Stanford Univ., Aug., 1986.
Rzedzian, ". . . Whole-Body MR Imaging . . . ", Proc. 6th Annual Meeting SMRM, pp. 229, 1987.
Coxon et al., ". . . Separated Images . . . ", Proc. 7th Annual Meeting SMRM, pp. 242, 1988.
Murdoch et al., ". . . Multislice Imaging", J. of Magn. Res. 74, pp. 226-263, 1987.
Connolly et al., ". . . Solutions to . . . Selective Excitation Problem", IEEE Trans. on Medical Imaging, vol. MI-5, No. 2, Jun., 1986.

Primary Examiner—Hezron E. Williams
Assistant Examiner—Kevin D. O'Shea
Attorney, Agent, or Firm—Henry K. Woodward

[57] ABSTRACT

Disclosed is a method of obtaining magnetic resonance signals from a body which are spatially and spectrally selective comprising the steps of applying a static magnetic field (Bo) to said body thereby aligning nuclear spins, applying a modulated magnetic gradient (G(t)) to said body, applying an RF excitation pulse (B(t)) to said body to tip said nuclear spins, said RF excitation pulse being related to said modulated magnetic gradient whereby resulting magnetic resonance signals are spatially and spectrally dependent, and detecting said magnetic resonance signals. The steps can be repeated in a multi-slice or multi-spectral acquisition mode. The steps can be repeated in a rapid gradient echo pulse sequence.

10 Claims, 10 Drawing Sheets

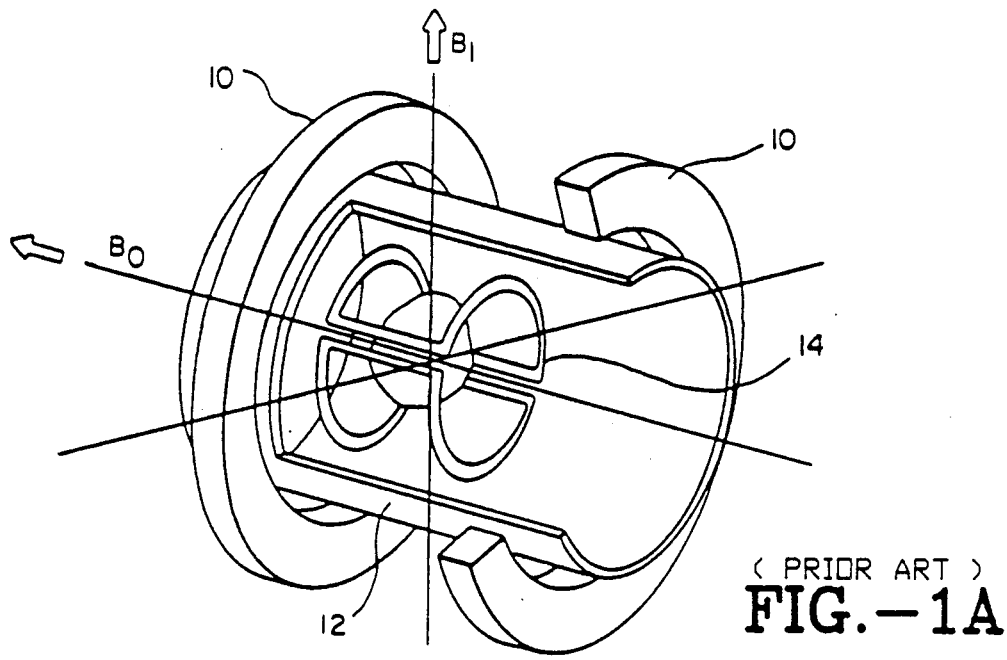
(PRIOR ART)
FIG.—1A
(PRIOR ART)
FIG.—1B
(PRIOR ART)
FIG.—1C
(PRIOR ART)
FIG.—1D
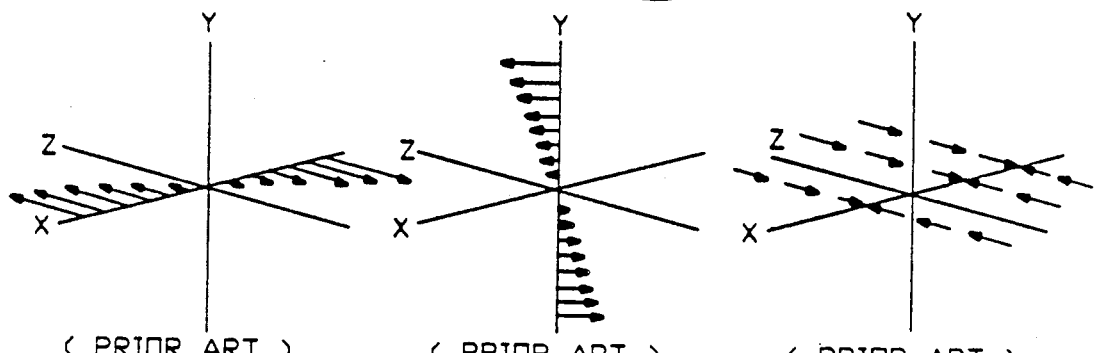
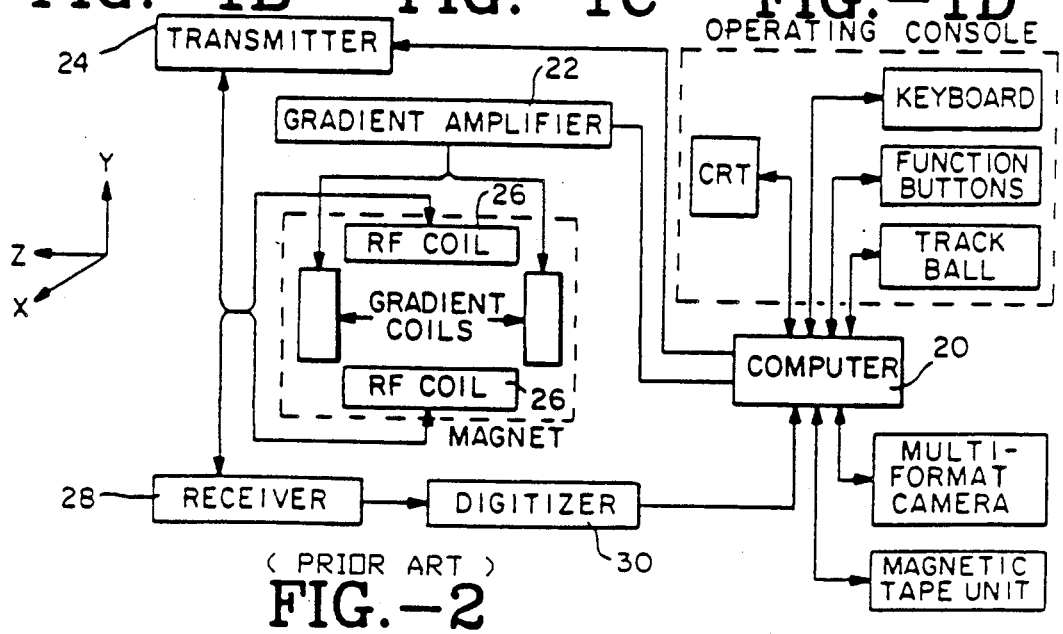
(PRIOR ART)
FIG.—2

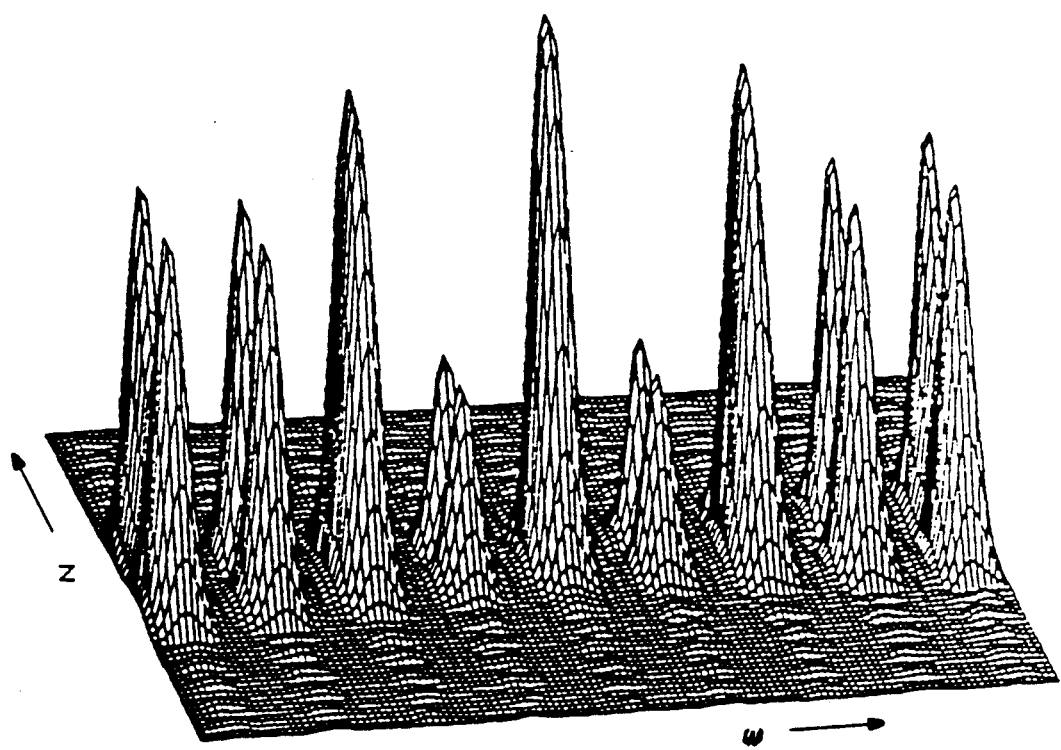
FIG.—8
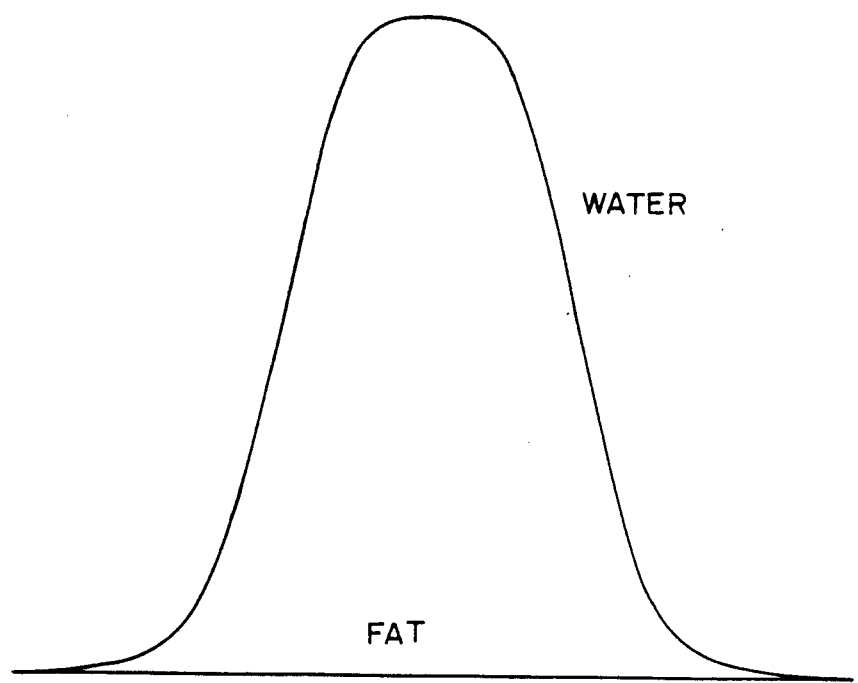
FIG.—9

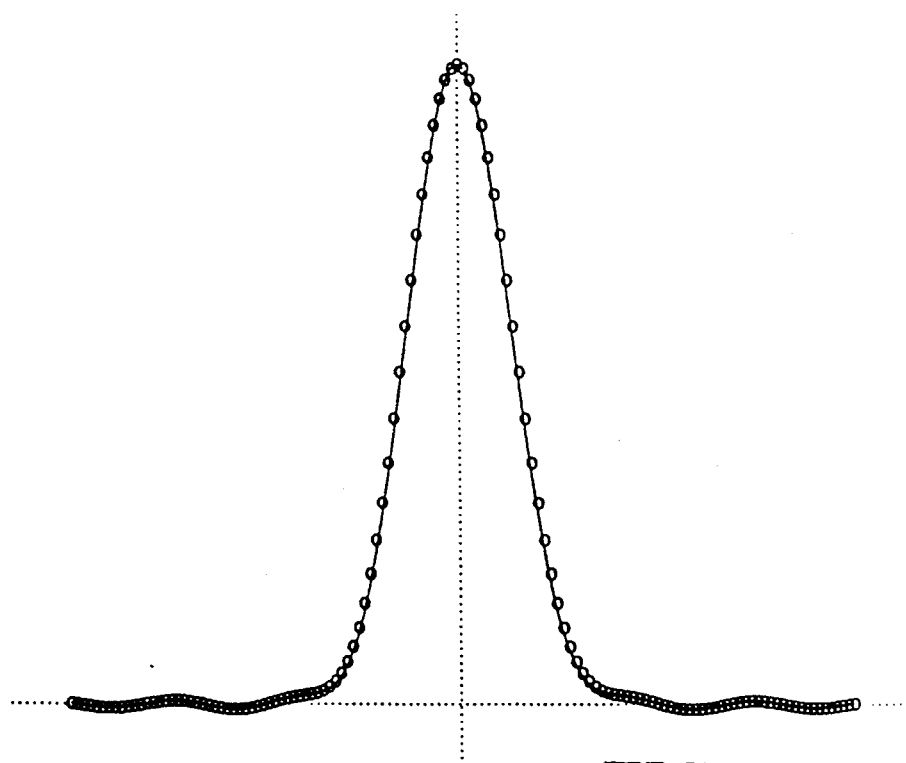
FIG.—10A
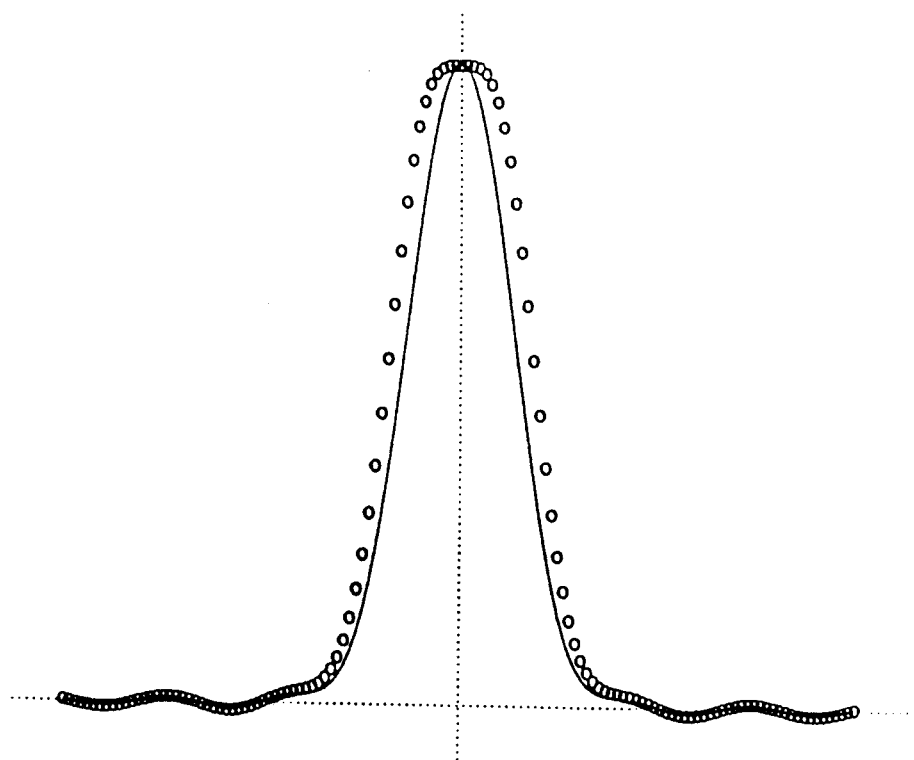
FIG.—10B

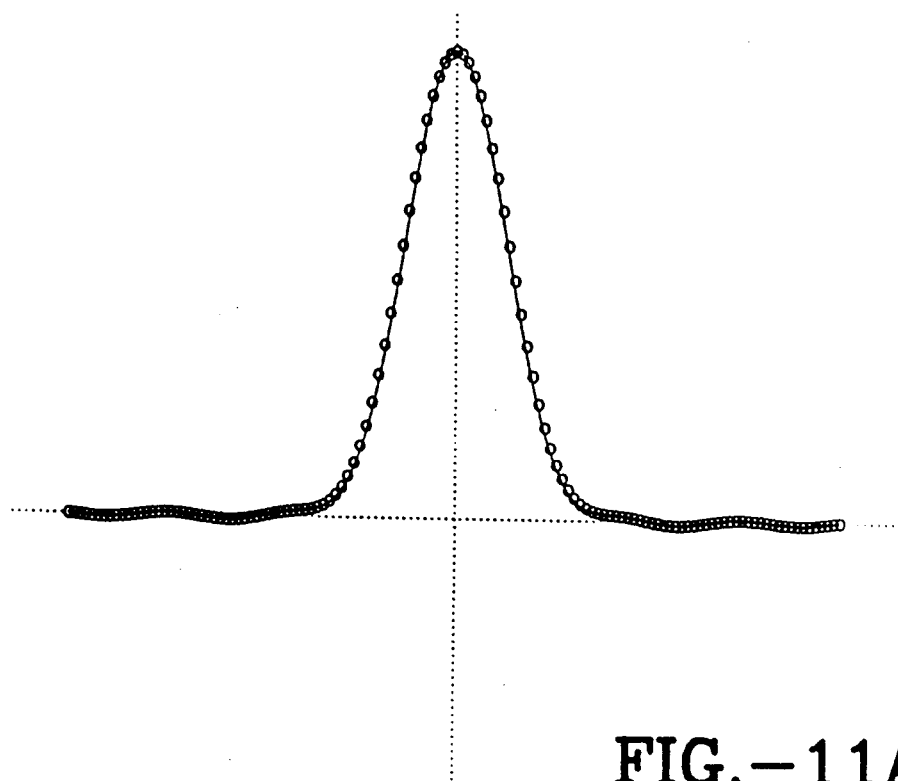
FIG.−11A
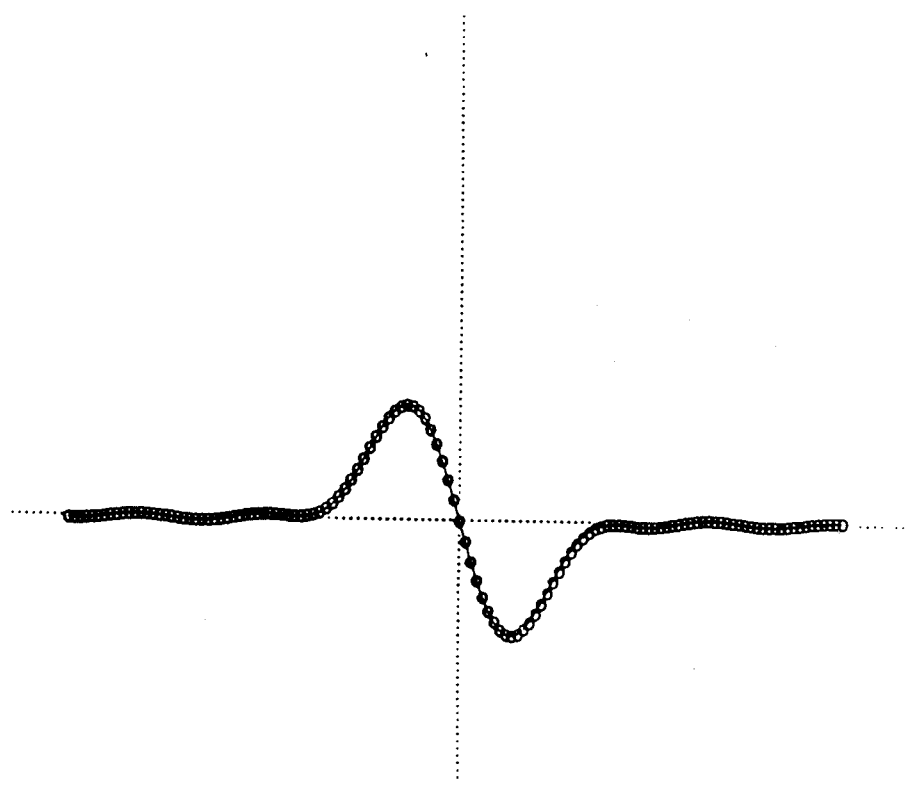
FIG.−11B

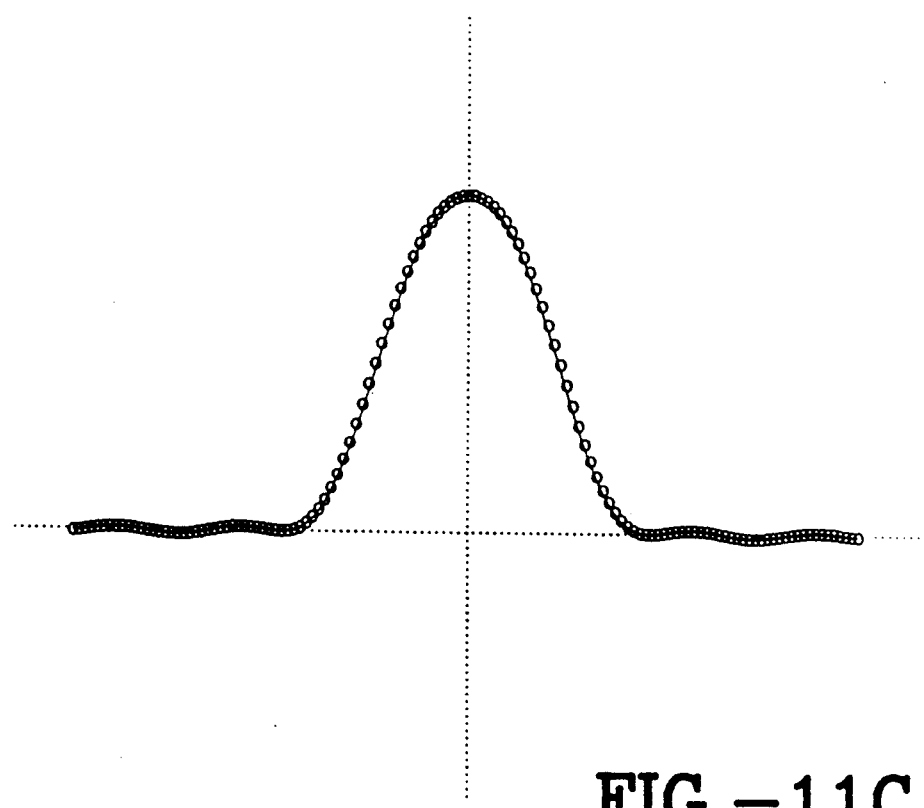
FIG.—11C
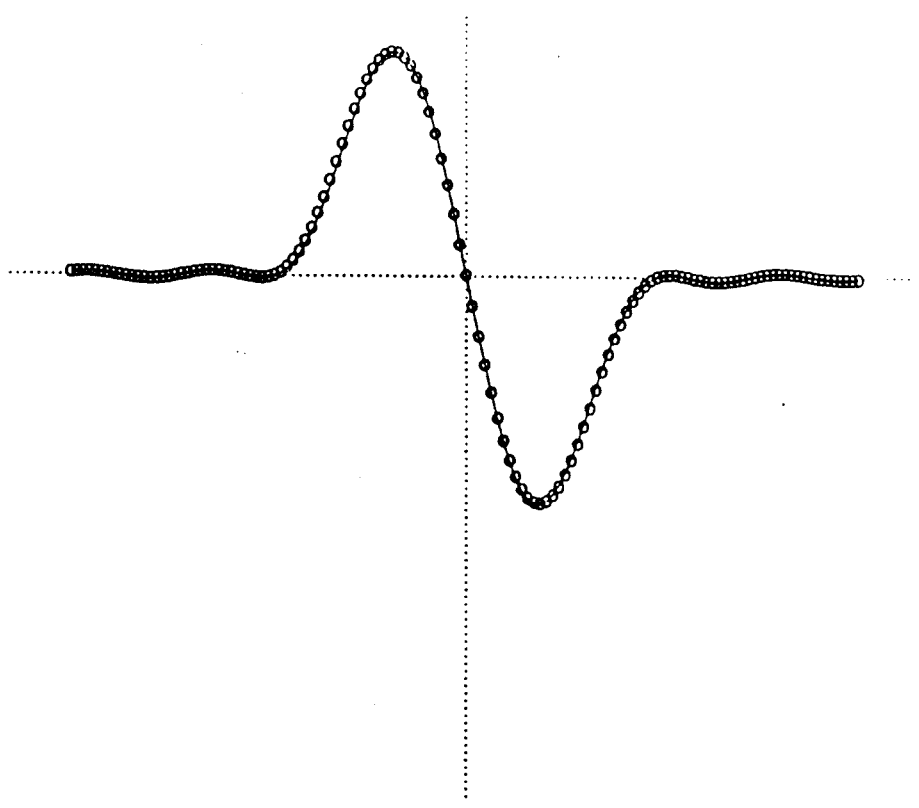
FIG.—11D

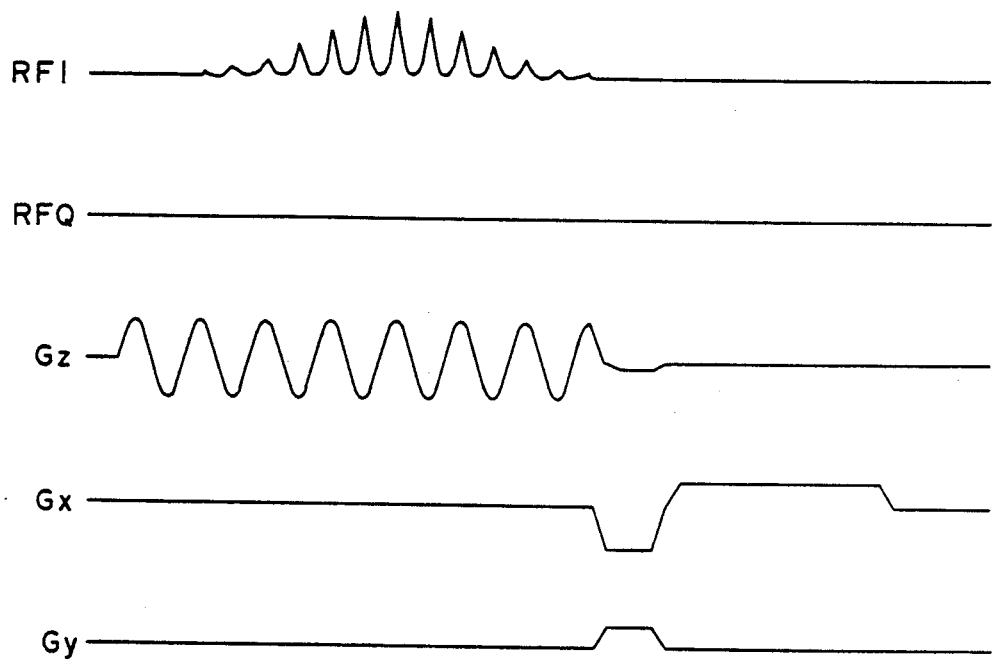
FIG.—12A
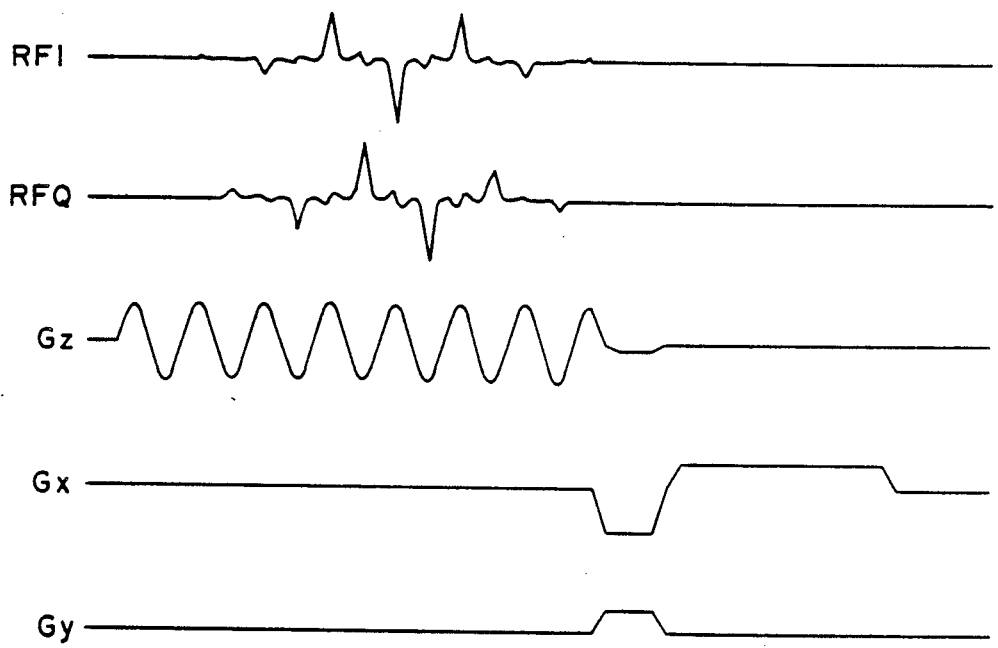
FIG.—12B

MAGNETIC RESONANCE IMAGING AND SPECTROSCOPY USING A SINGLE EXCITATION PULSE FOR SIMULTANEOUS SPATIAL AND SPECTRAL SELECTIVITY

The U.S. Government has rights in the disclosed invention pursuant to National Institute of Health grant #1RO1HL39297 to Stanford University.

BACKGROUND OF THE INVENTION

This invention relates generally to magnetic resonance imaging (MRI) and spectroscopy, and more particularly the invention relates to simultaneous spatial and spectral selectivity in MRI using a single excitation pulse.

Nuclear magnetic resonance (NMR) imaging, also called magnetic resonance imaging (MRI), is a nondestructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

A descriptive series of papers on NMR appeared in the June 1980 issue of the *IEEE Transactions on Nuclear Science*, Vol. NS-27, pp. 1220-1255. The basic concepts are described in the lead article, "Introduction to the Principles of NMR," by W. V. House, pp. 1220-1226, which employ computed tomography reconstruction concepts for reconstructing cross-sectional images. A number of two- and three-dimensional imaging methods are described. Medical applications of NMR are discussed by Pykett in "NMR Imaging in Medicine," *Scientific American*, May 1982, pp. 78-88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field, $B_o$, and the so-called magnetogyric ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

For a number of imaging applications one would like to selectively examine a particular spatial slice and a particular spectral component of the object at the same time. The most important example of this is two-dimensional water/fat imaging. Water/fat imaging may be desirable as an end in itself, for example as a tool for examining atherosclerotic plaque. It may also be desirable to select for water or fat in order to avoid image artifacts, such as those encountered in rapid imaging sequences. Rapid imaging sequences based on steady-state free precession suffer from artifacts at water/fat boundaries. Rapid k-space scanning sequences can suffer intolerable shifts or blurring of either water or fat.

Many techniques for forming water/fat images using spectrally-selective excitation sequences have been studied. Most of these techniques combine a spatially-selective pulse with an additional spectrally-selective pulse; however, multi-slice acquisition is impossible with these techniques. One recent technique uses two offset spatially-selective pulses. However, for many applications a single pulse that is simultaneously spectrally selective and spatially selective would be preferable to a combination of pulses.

A k-space interpretation of small-tip excitation is given by Pauly, Nishimura, and Macovski in "A k-space Analysis of Small-Tip-Angle Excitation," *Journal of Magnetic Resonance* 81, 43-56 (1989). The present invention uses this k-space interpretation of small-tip-angle excitation to provide a single pulse that is simultaneously spatially and spectrally selective.

SUMMARY OF THE INVENTION

An object of the present invention is improved fast-scan magnetic resonance imaging.

Another object of the invention is a method of exciting an object with a single RF pulse which is simultaneously spatially and spectrally selective.

Still another object of the invention is an improved method of designing a simultaneously spatially and spectrally selective excitation pulse.

Our design of a spatially and spectrally selective single excitation pulses uses the k-space given by Pauly et al., supra. From this analysis comes an expression for the magnetization excited in the presence of oscillating magnetic gradients. Finally, the spatial-spectral pulse is designed.

Briefly, a conventional magnetic resonance imaging system can be employed in which a strong static magnetic field, $B_O$, has a modulated gradient field, $G_Z(t)$, applied thereto. The gradient modulation frequency, $\Omega$, determines the spacing of spectral islands along a frequency axis, $\omega$, which permits spectral selectivity. For water/fat selectivity, $\Omega$ is twice the difference frequency, or twice 230 Hz at 1.5 Tesla. The RF excitation pulse is then defined in terms of the gradient modulation frequency, $\Omega$, pulse duration time, T, and certain constants (U, V) to achieve a desired slice profile and slice width.

One expression of a sinusoidal pulse using sinusoidal oscillations is given by the equation $$B_1(t) = B_1 e^{-\pi[\frac{\sin\Omega(t-T)}{U}]^2} e^{-\pi[\frac{t-(T/2)}{V}]^2} \cos\Omega(t-T)$$

$$G_z(t) = G\cos\Omega(t-T),\ 0 \leq t \leq T.$$

The invention and objects and features thereof will be more readily apparent from the following detailed description and appended claims when taken with the drawing.

BRIEF DESCRIPTION OF THE DRAWINGS

FIGS. 1A-1D illustrate the arrangement of conventional MRI apparatus and magnetic fields generated therein.

FIG. 2 is a functional block diagram of MRI imaging apparatus.

FIG. 8 is a plot of $|M_{xy}|$ vs. z and $\omega$ for the pulse of FIG. 5 at a flip angle of 90°.

FIG. 9 is a plot of $M_{xy}$ versus Z at resonant frequencies corresponding to water and fat for a computer simulation of spatial-spectral pulse of FIG. 5 at a flip angle of 90°.

FIGS. 10A-10B are plots of My versus x at $\omega=0$ at two different flip angles for the spatial-spectral pulse of FIG. 5.

FIGS. 11A-11D are plots of $M_y$ versus x at 30° for the spatial-spectral pulse of FIG. 5 and illustrate the main lobe, first side lobe, second side lobe and third side lobe, respectively.

FIGS. 12A and 12B are curves illustrating a rapid imaging pulse sequence for water-selective and fat-selective, respectively, using the spatial-spectral pulse in accordance with the invention.

DETAILED DESCRIPTION OF ILLUSTRATIVE EMBODIMENTS

Figure 3:
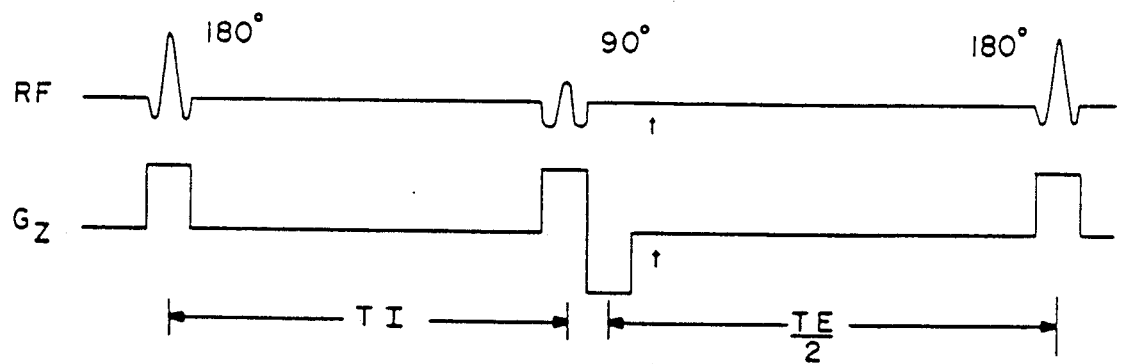
FIG. 3 illustrates a conventional basic pulse sequence for imaging.

Referring now to the drawings, FIG. 1A is a perspective view partially in section illustrating coil apparatus in an NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338-350. Briefly, the uniform static field $B_o$ is generated by the magnet comprising the coil pair 10. A gradient field $G_x$ is generated by a complex gradient coil set which can be wound on the cylinder 12. An RF field $B_l$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

FIG. 3 is a graph illustrating applied RF pulses for a 180° flip angle and a 90° flip angle followed by a "time reversal" 180° pulse and the associated Z axis magnetic field gradient applied during application of the RF pulses. The illustrated pulses are conventional sinc pulses which have front and back lobes with a main RF pulse therebetween. From this representation, it can be seen that the angle of flip is proportional to the area under the pulse.

In accordance with the present invention, a single RF excitation pulse is defined for small tip angle excitation which is simultaneously spatially and spectrally selective. The invention uses the k-space interpretation of small-tip-angle excitation disclosed by Pauly et al, supra.

Excitation K-Space

Pauly et al. introduced a k-space interpretation of small-tip-angle selective excitation. They showed that multi-dimensional selective excitation in the presence of time-varying gradients can be analyzed using Fourier transform theory. Using this interpretation, they designed and implemented selective excitation pulses that are selective in two spatial dimensions. This k-space interpretation of excitation provides many of the same conceptual advantages as the well-known k-space interpretation of the readout mode of MR imaging, although it differs in some important respects.

We first summarize the k-space interpretation of selective excitation. Using the well-known small-tip-angle approximation, the Bloch equation can be solved to give the following expression for the transverse magnetization:

$$M_{xy}(r) = i\gamma M_0(r) \int_K W(k)S(k)e^{ir\cdot k}dk. \qquad [1]$$

where $$W(k(t)) = \frac{B_1(t)}{|k(t)|} \qquad [2]$$

$$S(k) = \int_0^T \{\delta(k(t)-k)|k(t)|\}dt. \qquad [3]$$

We will define the relevant k-space variables shortly. W(k) is a weighting function in multidimensional k- space. S(k) is a sampling grid in k-space. The factor $|k(t)|$ normalizes S(k) so that it is a unit-strength line delta. A unit-strength line delta is defined as a line delta that integrates to unity along a unit-length path. The transverse magnetization excited is proportional to the product of the initial magnetization and the inverse Fourier transform of the product of W(k) and S(k). In designing an excitation pulse having a given spatial distribution and its associated transform, one first chooses a k trajectory such that S(k) provides an adequate k-space sampling grid. Then one can choose W(k) as the Fourier transform of the desired transverse magnetization, within the limits of the small-tip approximation. Once S(k) and W(k) are chosen, it is straightforward to determine the corresponding gradient and RF waveforms.

The problem of designing a pulse that is spatially and spectrally selective is similar to the problem of designing a pulse that is selective in two spatial dimensions. We wish to design a pulse that is selective in both the slice selection direction, z, and the spectral direction, $\omega$. We thus define k-space axes corresponding to z and $\omega$ as follows:

$$k_z(t) = -R \int_t^T G_z(s)ds \qquad k_\omega(t) = t - T \qquad [4]$$

Note that the integration defining $k_z$ ranges over the time remaining in the interval, in contrast to readout k space, where the integration ranges from the start of the interval up to the observation time.

The constant R in Equation 4 is a constant that is defined differently for different design problems. To design a pulse in two spatial dimensions, we would set R equal to gamma, the gyromagnetic ratio. In that case the units of $k_z$ would be the reciprocal of the units of distance. In our problem, we have two k-space axes whose natural units are different. We choose the units of R so that $k_z$ has the same units as $k_\omega$, e.g. seconds. This means that the numerical value that we choose for R is arbitrary; we are in effect choosing a relation between the natural units of the axes. We will discuss how one might choose the value of R later. In the design of a pulse, R is used to compute the normalization factor, $|k(t)|$, in Eqs. 2 and 3, and it is used to calculate the resulting magnetization. When one is just interested in the spatial slice width, one can convert $k_z$ back to natural units by setting R=gamma.

Because the k trajectory is constrained to move linearly with time along the $k_\omega$ axis, one must oscillate the slice-selection gradient to generate an adequate sampling structure in ($k_z$, $k_\omega$) space. Various forms of oscillation could be used. Most of our discussion will center upon sinusoidal oscillation of the following form:

$$G_z(t) = G \cos \Omega(t-T), \ 0 \leq t \leq T. \qquad [5]$$

This $G_z(t)$ corresponds to the following k trajectory:

$$k_z = \frac{RG}{\Omega} \sin\Omega(t - T) = \frac{RG}{\Omega} \sin\Omega k_\omega, \ -T \leq k_\omega \leq 0. \qquad [6]$$

Figure 4:
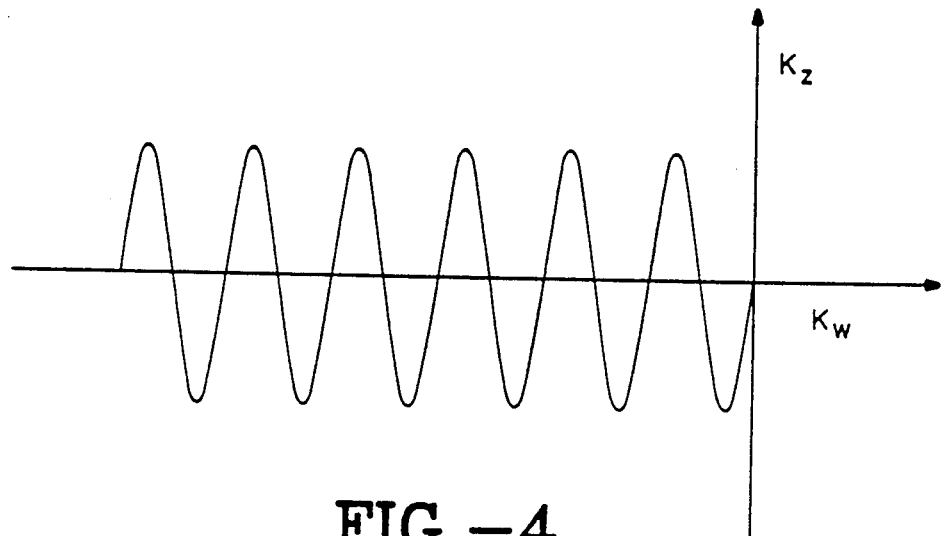
FIG. 4 is a plot of excitation k-space trajectory for a spatial-spectral pulse with a sinusoidal slice-selection gradient.

This k trajectory is shown in FIG. 4. Rather than starting at the origin as in readout k space, it ends at the origin, as a consequence of Eq. 4.

Theory

Using the small-tip-angle approximation, we will now calculate the magnetization excited by a spatial-spectral pulse having a sinusoidal slice-selection gradient. This magnetization is proportional to the product of $M_0(\omega, z)$ and the two-dimensional (2D) inverse Fourier transform of the product of S(k) and W(k).

Let us define the one-dimensional (1D) Fourier transform and its inverse as follows.

$$F(u) = \int_{-\infty}^{\infty} f(x) e^{-iux} dx \quad f(x) = \frac{1}{2\pi} \int_{-\infty}^{\infty} F(u) e^{iux} du. \qquad [7]$$

We designate 1D forward and inverse transforms by $F\{\}$ and $F^{-1}\{\}$, respectively, and their 2D counterparts by $^2F\{\}$ and $^2F^{-1}\{\}$. We use * to represent 1D convolution and ** to represent 2D convolution. We define the rectangle function such that rect(x)=1, for $|x| < \frac{1}{2}$.

First we study the inverse Fourier transform of the unit-strength sinusoidal line delta, S(k). We define the delta as $$S(k) = \sqrt{R^2G^2\cos^2\Omega k_\omega + 1} \ \delta\left(k_z - \frac{RG}{\Omega}\sin\Omega k_\omega\right). \qquad [8]$$

Let S(k) extend over the infinite interval. Any realizable S(k) will of course be of finite extent along the $k_\omega$ axis; we will account for this in W(k). S(k) is periodic along the $k_\omega$ axis with period $2\pi/\Omega$. We can decompose it into a 1D Fourier series with $k_z$ as a parameter. We calculate the series coefficients, $C_n$, as follows:

$$C_n(k_z) = \frac{\Omega}{2\pi} \int_{-\frac{\pi}{\Omega}}^{\frac{\pi}{\Omega}} \sqrt{R^2G^2\cos^2\Omega k_\omega + 1} \ \delta\left(k_z - \frac{RG}{\Omega}\sin\Omega k_\omega\right) e^{in\Omega k_\omega} dk_\omega. \qquad [9]$$

We want to express the argument of the delta function in the form $k_w - f(k_z)$, which involves inverting the sin function. Because $\sin^{-1}$ is a multi-valued function, we must decompose this integral into four subintegrals, each ranging over a quarter of a cycle of $\sin \Omega k_\omega$. The first subintegral is $$\frac{\Omega}{2\pi} \int_{-\frac{\pi}{\Omega}}^{-\frac{\pi}{2\Omega}} S(k_z, k_\omega) e^{in\Omega k_\omega} dk_\omega$$

$$= \int_{-\frac{\pi}{\Omega}}^{-\frac{\pi}{2\Omega}} \beta(k_z)\delta\left(k_\omega - \left[-\frac{\pi}{\Omega} - \frac{1}{\Omega}\sin^{-1}\left(\frac{\Omega}{RG}k_z\right)\right]\right) e^{in\Omega k_\omega} dk_\omega \qquad [10]$$

$$= \beta(k_z) e^{-in\pi} e^{-in\sin^{-1}(\frac{\Omega}{RG} k_z)}. \qquad [11]$$

where $$\beta(k_z) = \frac{\Omega}{2\pi} \frac{\sqrt{1 - \left(\frac{\Omega k_z}{RG}\right)^2} + \frac{1}{R^2 G^2}}{\sqrt{1 - \left(\frac{\Omega k_z}{RG}\right)^2}} =$$ [12]

$$A \frac{\Omega}{2\pi} \frac{\sqrt{1 - \left(\frac{\Omega k_z}{ARG}\right)^2}}{\sqrt{1 - \left(\frac{\Omega k_z}{RG}\right)^2}},$$

where $$A = \sqrt{1 + \frac{1}{R^2 G^2}}.$$ [13]

In Eq. 10 we have replaced the unit delta function of Eqs. 8 and 9 with a unit delta function that is equivalent within the limits of integration. For the remaining subintegrals the form of the equivalent unit delta function is slightly different; the argument of the delta varies, although the normalization factor remains the same. Table 1 summarizes the results for the four subintegrals.

TABLE 1

Fourier Series Coefficient Subintegrals

| Limits | Argument of δ( ) | Result | Range of $k_z$ |
|---|---|---|---|
| $-\frac{\pi}{\Omega}$ to $-\frac{\pi}{2\Omega}$ | $k_\omega + \frac{\pi}{\Omega} + \frac{1}{\Omega} \sin^{-1}\left(\frac{\Omega}{RG} k_z\right)$ | $\beta(k_z) e^{-in\pi} e^{-in\sin^{-1}(\frac{\Omega}{RG} k_z)}$ | $-\frac{RG}{\Omega} \leq k_z < 0$ |
| $-\frac{\pi}{2\Omega}$ to $0$ | $k_\omega - \frac{1}{\Omega} \sin^{-1}\left(\frac{\Omega}{RG} k_z\right)$ | $\beta(k_z) e^{in\sin^{-1}(\frac{\Omega}{RG} k_z)}$ | $-\frac{RG}{\Omega} \leq k_z < 0$ |
| $0$ to $\frac{\pi}{2\Omega}$ | $k_\omega - \frac{1}{\Omega} \sin^{-1}\left(\frac{\Omega}{RG} k_z\right)$ | $\beta(k_z) e^{in\sin^{-1}(\frac{\Omega}{RG} k_z)}$ | $0 \leq k_z \leq \frac{RG}{\Omega}$ |
| $\frac{\pi}{2\Omega}$ to $\frac{\pi}{\Omega}$ | $k_\omega - \frac{\pi}{\Omega} + \frac{1}{\Omega} \sin^{-1}\left(\frac{\Omega}{RG} k_z\right)$ | $\beta(k_z) e^{in\pi} e^{-in\sin^{-1}(\frac{\Omega}{RG} k_z)}$ | $0 \leq k_z \leq \frac{RG}{\Omega}$ |

Each integral is valid for a particular range of $k_z$. We add the integrals in each $k_z$ range to determine the following Fourier series coefficients:

$$C_n(k_z) = \begin{cases} \beta(k_z) \, 2 \, \mathrm{rect}\left(\frac{\Omega k_z}{2RG}\right) \cos\left[n\sin^{-1}\left(\frac{\Omega k_z}{RG}\right)\right] \\ \quad \text{for } n \text{ even} \\ \beta(k_z) \, 2i \, \mathrm{rect}\left(\frac{\Omega k_z}{2RG}\right) \sin\left[n\sin^{-1}\left(\frac{\Omega k_z}{RG}\right)\right] \\ \quad \text{for } n \text{ odd} \end{cases}$$ [14]

Substituting Eq. 12 into Eq. 14 and performing an inverse Fourier transform yields $$F^{-1}\{C_n(k_z)\} = K_1 \frac{J_1(Az')}{2Az'} \cdot J_n(z'),$$ [15]

where $K_1$ is a constant and $$z' = \frac{RGz}{\Omega}.$$ [16]

The Fourier series for S(k) is $$S(k_z, k_w) = \sum_{n=-\infty}^{\infty} C_n(k_s) e^{-ink_w\Omega}.$$ [17]

The inverse Fourier transform of this series representation of S(k) is $$^2F^{-1}\{S(k_w, k_z)\} = \sum_{n=-\infty}^{\infty} F^{-1}\{C_n(k_z)\}\delta(\omega - n\Omega)$$ [18]

$$= K_1 \frac{J_1(Az')}{2Az'} \cdot \sum_{n=-\infty}^{\infty} J_n(z')\delta(\omega - n\Omega).$$

The transform of S(k) is thus a series of weighted line deltas parallel to the $k_z$ axis and separated by $\Omega$, the gradient modulation frequency.

Assuming $W(k_z, k_\omega) = W(k_z) W(k_\omega)$, the resulting transverse magnetization excited by the pulse is $$M_{xy}(z,\omega) = i2\pi\gamma M_0(z,\omega) \, F^{-1}\{W(k_w)\}\delta(k_z) \cdot \cdot$$ [19]

$$\left(\sum_{n=-\infty}^{\infty} F^{-1}\{C_n(k_z)w(k_z)\}\delta(\omega - n\Omega)\right).$$

Combining Eq. 19 with Eq. 15 yields $$M_{xy}(z,\omega) = K_2 \, M_0(z,\omega) \, F^{-1}\{W(k_w)\}\delta(k_z) \cdot \cdot$$ [20]

$$\sum_{n=-\infty}^{\infty} \left[F^{-1}\{W(k_z)\} \cdot \frac{J_1(Az')}{2Az'} \cdot J_n(z')\right]\delta(\omega - n\Omega).$$

where $K_2$ is a constant. This result shows that the nth sidelobe has the form of a smoothed $J_n$ in the z direction and the form of the inverse transform of $W(k_\omega)$ in the $w$ direction. Assuming that the spacing of the spectral islands, $\Omega$, is large compared to the width of $F^{-1}\{W(k)\}$ Eq. 20 permits straightforward calculation of $M_{xy}$ for separable W.

One can also calculate $M_{xy}$ by looking at the solution of the Bloch equation in the time domain. This solution can be written as $$M_{xy}(z,\omega) = i\gamma M_0(z,w) \int_0^T B_1(t) e^{i\frac{\gamma Gz}{\Omega} \sin\Omega(t-T)} e^{i\omega(t-T)} dt. \quad [21]$$

Using the identity $$e^{i\alpha \sin\Omega t} = \sum_{n=-\infty}^{\infty} J_n(\alpha) e^{in\Omega t}, \quad [22]$$

we can rewrite Eq. 21 as $$M_{xy}(z,\omega) = \quad [23]$$

$$i\gamma M_0(z,\omega) \sum_{n=-\infty}^{\infty} J_n\left(\frac{\gamma Gz}{\Omega}\right) \int_0^T B_1(t) e^{i(n\Omega+\omega)(t-T)} dt.$$

Here we also arrive at an infinite sum containing $J_n$. This equation can be used to calculate $M_{xy}$ although Eq. 20 is more practical for most purposes. To approximately calculate the sidelobe at $\omega = k\Omega$, the infinite sum in Eq. 23 can be replaced by a finite sum centered at $n = -k$. The number of terms required depends upon how rapidly $B_1(t)$ varies.

To this point we have assumed that the slice-selection gradient varies in a sinusoidal fashion. This is a convenient waveform to generate experimentally, and all of our experiments and simulations have been performed using such a gradient. However, we can also calculate the magnetization resulting when a square-wave gradient is employed. The derivation is similar to that in the sinusoidal case, so we just present the result here.

Assume that $G_z(t)$ is a square wave of amplitude G and period T. The resulting magnetization can then be expressed by $$M_{xy}(z,\omega) = K_3 M_0(z,\omega) F^{-1}\{W(k_w)\}\delta(k_z) * * \quad [24]$$

$$\sum_{n=-\infty}^{\infty} [F^{-1}\{W(k_z)\} * a_n(z)]\delta(\omega - n\Omega),$$

where $K_3$ is a constant and $$a_n(z) = \begin{cases} \text{sinc}\left(z'' + \frac{n}{2}\right) + \text{sinc}\left(z'' - \frac{n}{2}\right) \\ \quad \text{for } n \text{ even} \\ \text{sinc}\left(z'' + \frac{n}{2}\right) - \text{sinc}\left(z'' - \frac{n}{2}\right) \\ \quad \text{for } n \text{ odd} \end{cases} \quad [25]$$

In this equation $$\text{sinc}(x) = \frac{\sin \pi x}{\pi x} \text{ and } z'' = \frac{RGT}{2\pi} z.$$

Design Considerations

We now have expressions for the magnetization excited by a pulse in the presence of an oscillating slice-selection gradient. Using these expressions, we can discuss the design of pulses that are simultaneously selective in space and resonant frequency. Some of the considerations in the design of these pulses are (1) the functional form of the slice-selection gradient, which determines the k trajectory, (2) the placement of the desired and undesired components relative to the frequency sidelobes, (3) the amplitude and frequency of the slice-selection gradient, (4) the functional form of the RF envelope, which determines the k-space weighting and thus the spatial and spectral slice profiles, (5) the length of the pulse, and (6) the modulation of these pulses to shift them in space and frequency. In this section we discuss these considerations in the context of the design of a water/fat-selective slice-selection pulse.

We wish to design a slice-selective pulse that excites water protons and discriminates against fat protons, or vice versa. The target field strength is 1.5 Tesla, where the difference frequency between water and fat is about 230 Hz. We assume that the main field inhomogeneity across the slice is less than ±1 ppm.

The main requirement for the slice-selection gradient, $G_z$, is simply that it oscillate in some manner so that the $k_\omega$ axis is sampled. Even without referring to k-space arguments, it makes intuitive sense that a spatial-spectral pulse would need such a $G_z$. We know that any long RF pulse will be spectrally selective in the absence of gradients. We want to add a $G_z$ while preserving this spectral selectivity. One way to prevent chemical shift from simply mapping into a shift in the slice-selection direction is to oscillate the gradient. True square-wave gradients are impractical because of slew-rate limitations. Here we choose sinusoidal gradients, which are simple to generate and allow us to verify the theory of the previous section. Trapezoidal gradients are another practical choice.

Before choosing a gradient modulation frequency, we must decide where in the spectrum to place the undesired component, relative to the frequency sidelobes of the excitation pulse. For this discussion, let us assume water is the desired component and fat the undesired component. Water is placed at the central lobe. The simplest method, and the one that we adopt here, is to place fat at the null between the main lobe and the first sidelobe. The required gradient modulation frequency for this method is twice the water/fat difference frequency (460 Hz for 1.5 T). This method leads to the maximum frequency separation between the sidelobes, which has two positive effects: (1) the transition band between water and fat is broad, so that the pulse can be short, and (2) the water/fat separation is relatively insensitive to main field inhomogeneity. The main disadvantage of this method is that the minimum slice width is limited, both because the maximum gradient amplitude is limited by slew-rate constraints and because the short gradient period limits the extent of the $k_z$ excursion. If the slice width or slice profile is not acceptable using the above method, then fat can be placed elsewhere (e.g. between the first and second sidelobe) or greater gradient power can be used. It may be advantageous in some circumstances to place fat closer to an odd sidelobe than to an even sidelobe, because the odd symmetry of odd sidelobes results in a decreased integral across the slice.

The placement of fat is strongly influenced by the gradient power and the field strength of the system. When gradient power is sufficiently high, placing fat at the closest null will generally be preferable. For a fixed gradient power, the achievable slice width decreases as the field strength increases. At 1.5 T and using the gradient power available on commercial whole-body imagers, it is possible to achieve slice widths on the order of 1.0 to 1.5 cm placing fat at the closest null. This slice width is adequate for many applications. At higher field strengths it will be necessary to place fat elsewhere or to use stronger gradients. At field strengths below 1.0 T placing fat at the closest null should suffice for most applications.

Now that we have chosen the slice-selection gradient as a 460 Hz cosine, we can study the RF envelope. The spatial and spectral weighting can be chosen independently. Here we present a simple pulse with Gaussian weighting on both the $k_z$ and $k_\omega$ axes. This weighting leads to compact spectral and spatial slice profiles, which are Gaussian in shape in the small-tip-angle regime. In determining the equations for the pulse, we must choose the value of R, the arbitrary scaling factor for the $k_z$ axis. We want the spatial profile of the main lobe to be as close to the Fourier transform of $W(k_z)$ as possible. It is clear from Eq. 14 with $n=0$ that we want $A=1$, because $C_n(k_z)$ would then just be a rectangle function the width of $W(k_z)$. We thus choose R·G to be very large relative to one, leading to the approximation $$|k(t)| = \sqrt{k_z^2 + k_w^2} = \sqrt{(RG_z)^2 + 1'}$$

$$= \sqrt{[RG\cos\Omega(t - T)]^2 + 1} \quad [26]$$

$$\approx RG\cos\Omega(t - T). \quad [27]$$

The resulting equations for the pulse are $$B_1(t) = B_1 e^{-\pi[\frac{\sin\Omega(t-T)}{U}]^2} e^{-\pi[\frac{t-(T/2)}{V}]^2} \cos\Omega(t - T) \quad [28]$$

$$G_z(t) = G\cos\Omega(t - T), \; 0 \leq t \leq T. \quad [29]$$

Figure 5:
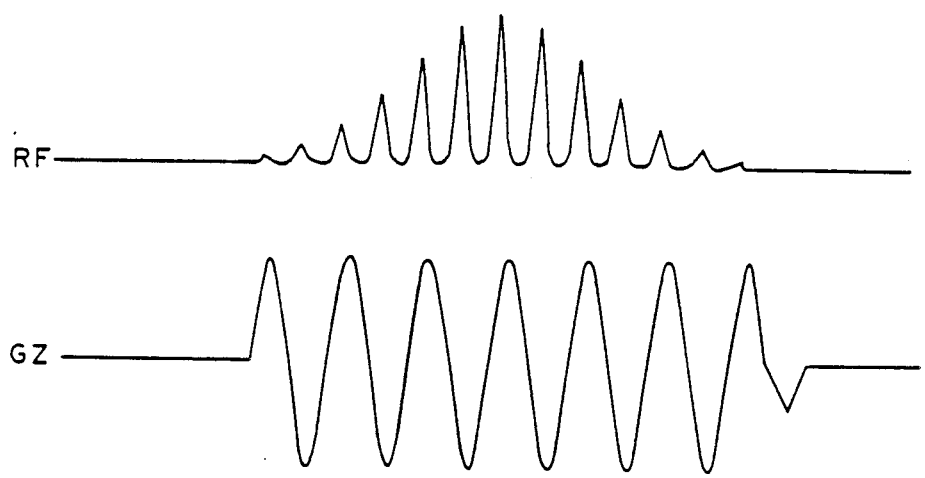
FIG. 5 is a plot of RF and slice-selection gradient for a spatial-spectral pulse with Gaussian k-space weighting along both $k_z$ and $k_\omega$.

FIG. 5 shows the RF and gradient waveforms for this pulse.

To achieve more rectangular pulse profiles, one can use sinc weighting on either axis. For flip angles in the nonlinear regime, the form of the spectral and spatial weighting can also be determined by a 2D extension of the 1D techniques for optimization of slice profiles.

With the form of the excitation determined, only the choice of the parameters T, U, V, and G remains. T must be chosen to be long enough so that the spectral transition band is narrower than the water/fat difference frequency. More-narrow transition bands lead to greater immunity to main field inhomogeneity. The maximum time that the RF amplifier can remain unblanked sets an upper limit on T. Spectral dephasing and $T_2$ decay during the pulse also limit T. In the small-tip-angle regime, an isochromat with a frequency offset of $\Delta\omega$ acquires a phase factor of $e^{-i\Delta\omega T/2}$ during the pulse, assuming that the weighting is symmetrical about the midpoint of the pulse. $T_2$ decay can be thought of as adding the weighting factor $e^{-(T-t)/T_2}$ to the desired weighting. We typically choose T to be equal to six cycles of $G_z$, which is equal to 13.0 msec. U and V are chosen such that the slice profiles are as narrow as possible without excessive ringing. G is simply chosen to achieve the desired slice width. The maximum gradient strength achievable on our experimental system is 0.7 G/cm for a 460 Hz sinusoid, which allows a minimum slice width of about 1.2 cm.

Figure 6A:
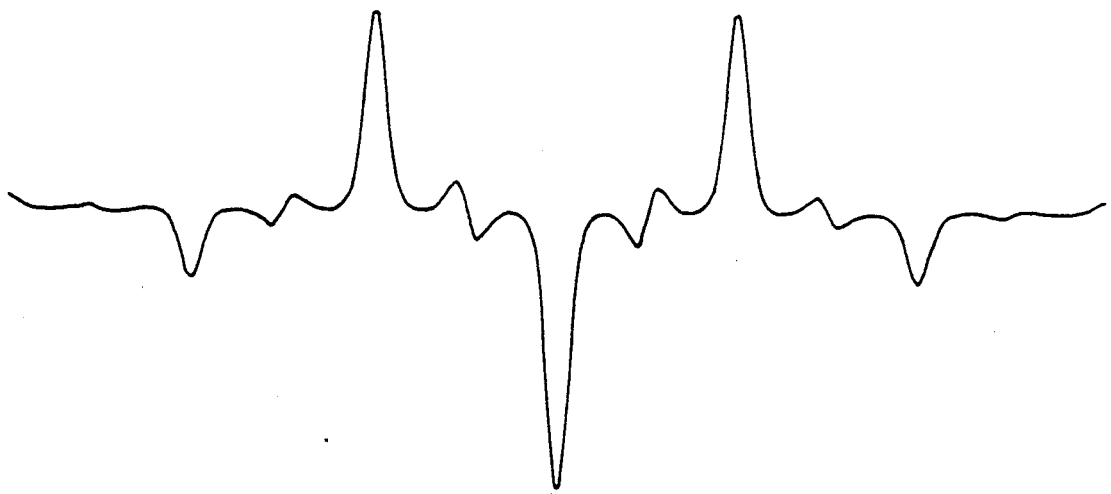
FIGS. 6A and 6B are plots of the in-phase and quadrature-phase modulation of an RF waveform to shift 230 Hz along the $k_\omega$ axis.
Figure 6B:
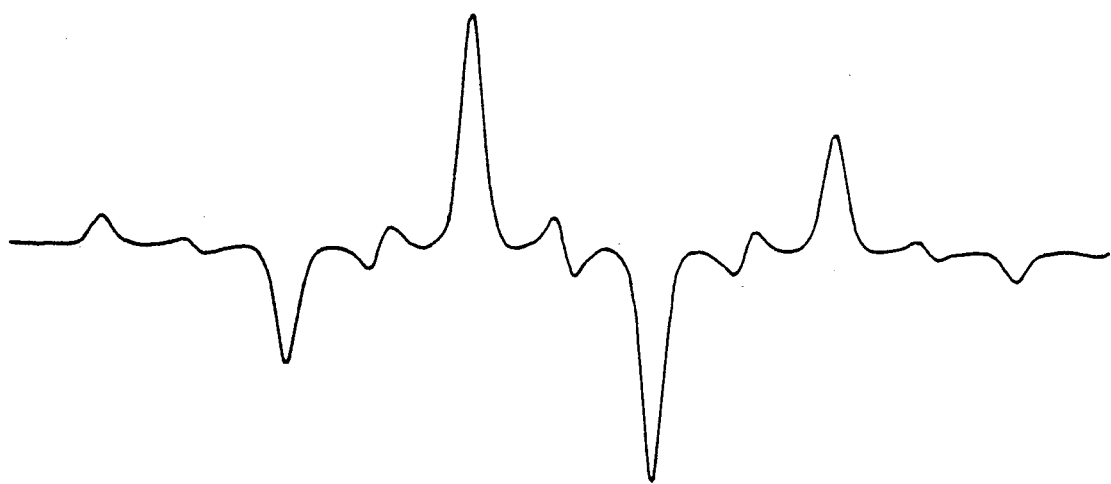

Now the specifications are complete for a pulse that excites water without exciting fat, assuming that the transmitter is tuned to the water frequency. It is a simple matter to produce a modulated version of this pulse that excites fat instead of water; one simply multiplies $B_1(t)$ from Eq. 28 by $e^{-i\Delta\omega t}$. The I- and Q-channel RF waveforms for a pulse that has been modulated by 230 Hz are shown in FIGS. 6A, 6B.

Figure 7A:
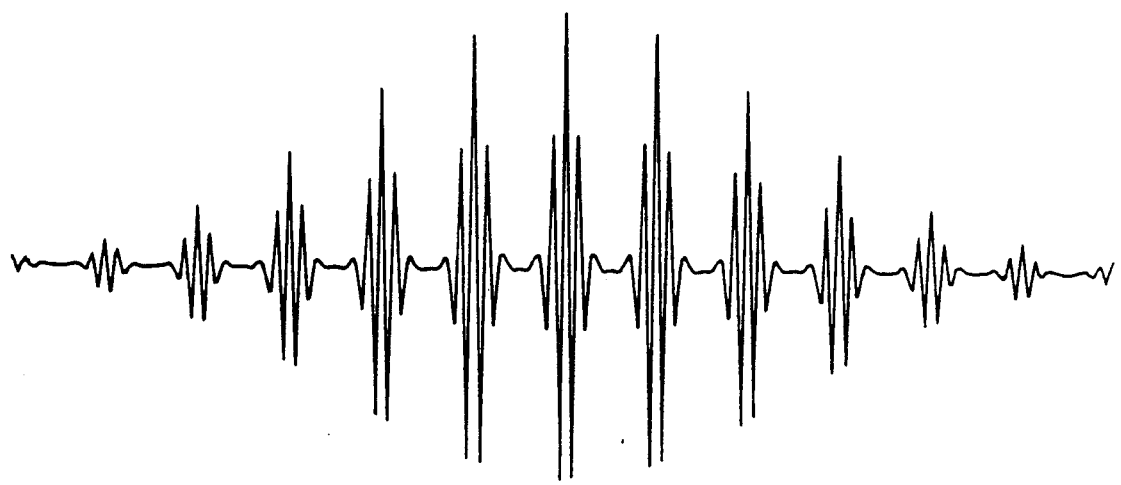
FIGS. 7A and 7B are the in-phase and quadrature phase modulation of the RF waveform of FIG. 2 to shift approximately 1.5 slice widths along the Z axis.
Figure 7B:
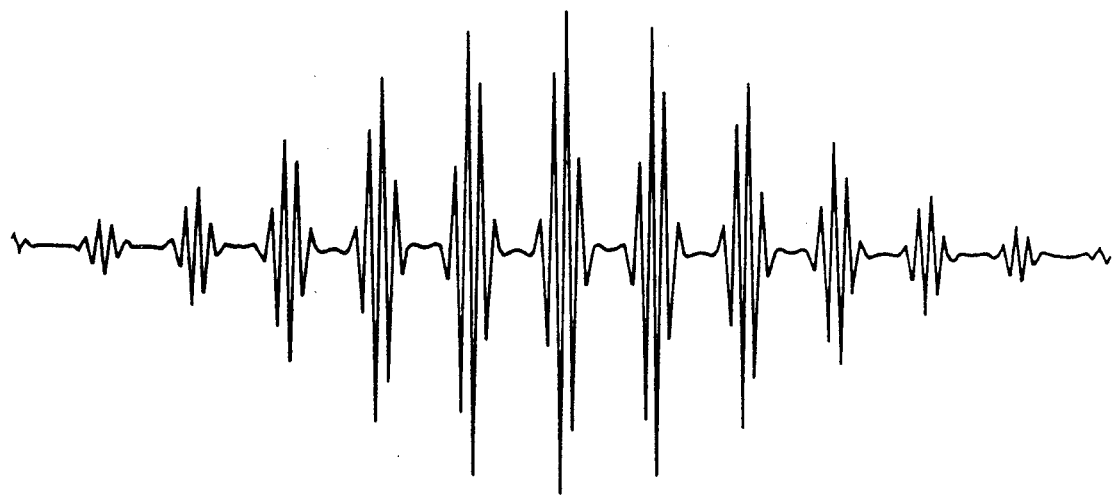

Modulating the pulse to produce a spatially-offset slice is only slightly more complicated. To offset the slice by $\Delta z$ one multiplies $B_1(t)$ by $e^{-iks(t)\Delta z}$. A pulse that is offset by approximately 1.5 slice widths is shown in FIGS. 7A, 7B.

Simulation Results

In the previous section we discussed a spatially-selective pulse designed to selectively excite either water or fat at 1.5 T. In this section we study the behavior of this pulse using a numerical simulation of the Bloch equation. We then compare the simulation results with the results predicted by the small-tip-angle theory. The simulations are performed on the pulse shown in FIG. 5. The object is assumed to be infinite and uniform, and relaxation is neglected. FIG. 8 shows the simulated $|M_{xy}|$ following a 90-degree pulse as a function of z and $\omega$. The center of the figure corresponds to $z=0$ and $\omega=0$. The form of the response agrees well with the small-tip-angle theory. Along the $\omega$ axis the islands are spaced at the gradient modulation frequency, $\Omega$. For the central lobe both the spectral and spatial slice profiles are Gaussian. The undesired component should be placed halfway between the central lobe and the first sidelobe along the $\omega$ axis, where there is a broad null. FIG. 9 compares $|M_{xy}|$ vs. z for the desired and undesired components. The relative suppression for the magnitude of the integral across the slice is 45.5 dB.

In computing the theoretical spatial response at the nth sidelobe, we ignored the contribution from other sidelobes in Eq. 20. We evaluated the following convolution discretely:

$$K_2 F^{-1}\{W(k_z)\} * \frac{J_1(Az')}{2Az'} * J_n(z'). \quad [30]$$

FIGS. 10A, 10B compare the main-lobe theoretical 6 $M_y$ vs. z with the simulated response for 30-degree and 90-degree flip angles. The only significant magnetization was in $M_y$, because the pulse was applied along the x axis. The simulated data was corrected for an arbitrary constant phase factor, but not for any spatially-varying phase.

The theoretical $M_y$ is almost indistinguishable from the simulated $M_y$ at 30 degrees, which indicates that small-tip-angle approximation is accurate. The response at 90 degrees deviates from the theory, but the resulting slice profile is actually more rectangular than the 30-degree profile.

FIGS. 11A–11D compare the theoretical $M_y$ vs. z with the 30-degree simulated response at the main lobe and the first three sidelobes. Once again the agreement is quite good. The even sidelobes have even symmetry and the odd sidelobes have odd symmetry, as predicted.

Experimental Results

Figure 13:
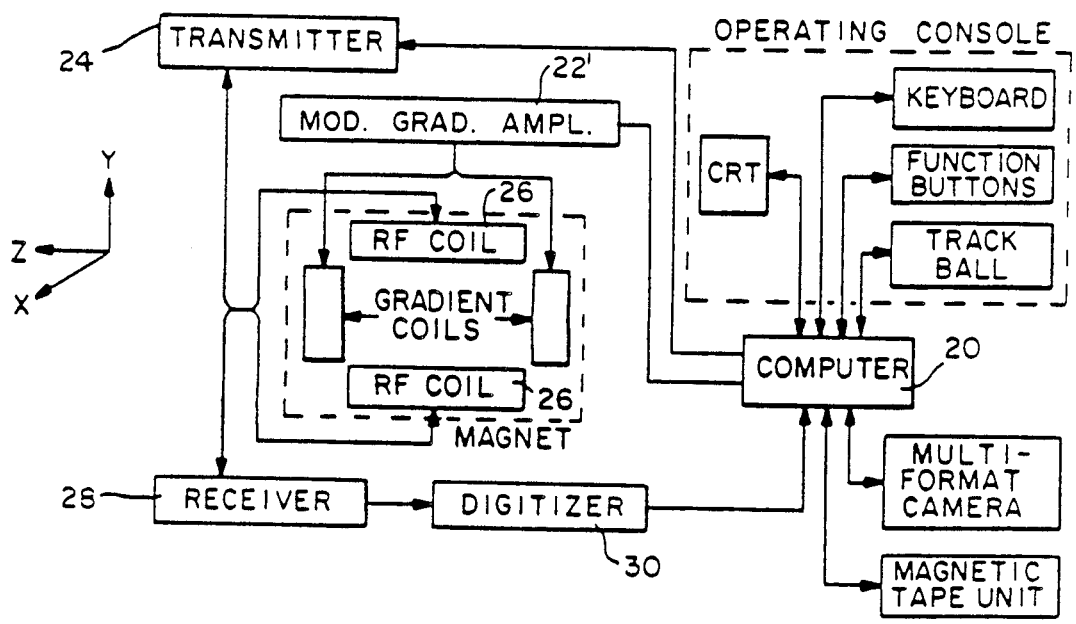
FIG. 13 is a functional block diagram of the MRI system as modified in accordance with the invention.

The pulse was implemented on a General Electric Signa 1.5 T whole-body imaging system with self-shielded gradient coils. FIG. 13 is a functional block diagram of the MRI system as modified in accordance with the invention to include a modulated gradient amplifier 22' with computer 20 controlling the amplifier 22' and the transmitter 24 in applying a modulated magnetic gradient and an RF excitation pulse as described above. The system of FIG. 13 is similar to the system shown in FIG. 2, and like elements have the same reference numerals. In order to experimentally verify the sidelobe behavior, two gradients were applied during the excitation: the sinusoidal slice-selection gradient along one direction and a constant gradient along an orthogonal direction. The constant gradient effectively simulates a chemical-shift axis. A 180-degree pulse selective in the third direction was applied, and a spin-warp gradient sequence imaged the resulting magnetization. The object was a large sphere of doped water. The resulting response agreed with the simulated response shown in FIG. 8.

Next the pulse was applied to a GRASS-type rapid imaging sequence to obtain water/fat images directly. The pulse sequence is shown in FIGS. 12A, 12B. The RF transmitter was tuned to the water frequency. FIG. 12A illustrates the water-selective portion of the sequence and FIG. 12B the fat-selective portion. These portions were alternated with negligible delay between successive sequences. Note that the effective repetition time for water or fat is twice the time between excitations, because the water-selective pulse does not perturb the fat protons and the fat-selective pulse does not perturb the water protons. By analogy to multi-slice acquisition, we can view this as multi-spectrum acquisition. With one average, both water and fat images were formed in 16 seconds. The slice width was approximately 1.2 cm, using a 0.7 G/cm, 460 Hz slice-selection gradient. The axial images of the head of a normal volunteer obtained with this sequence showed the optic nerves clearly visible in the water image, because the orbital fat was suppressed. The orbital and subcutaneous fat were visible in the fat image. Axial images of the body of a normal volunteer showed the absence of artifacts at the organ boundaries, in contrast to rapid images that were not selective for water or fat. Further, the blood vessels were well-defined and there were no visible flow artifacts. This indicates that the slice-selection gradient is well-behaved in the presence of flow, without any lobes added for flow compensation.

Summary

We have designed a single pulse that is simultaneously spatially and spectrally selective. We designed this pulse using the k-space interpretation of small-tip-angle excitation, an analysis technique developed by Pauly et al. We derived the inverse Fourier transform of infinite sinusoidal and square-wave line deltas to develop theoretical expressions for the magnetization excited in the presence of an oscillating slice-selection gradient. One useful example of a spatial-spectral pulse is a spatially-selective water/fat pulse. Discussed is the design of such a pulse for a whole-body 1.5 T imaging system. Also presented are computer simulations and experimental results that verified the theoretical expressions as valid. We then applied the pulse to a GRASS-type rapid imaging sequence. The resulting water/fat images are free of the chemical-shift artifacts commonly associated with such rapid imaging sequences.

There are a number of advantages of the spatial-spectral pulse. We have shown experimentally that it is useful in GRASS-type rapid imaging sequences, particularly in the abdomen. Problems with interference between water and fat at organ boundaries disappear. Because only one spectral element is excited at a time, multi-spectrum imaging is possible, as demonstrated by the alternation of the water and fat excitations in the GRASS-type sequence. The moments of the slice-selection gradient are small, so flow artifacts are minimized. At the end of pulse the magnetization is inherently refocused and the short refocusing interval is only necessary because of the finite gradient switching time. There is no misregistration in the z direction between the water and fat slices. Unlike water/fat sequences with one spatially-selective pulse and a separate spectrally-selective pulse, this pulse can be used in a multi-slice acquisition mode. This pulse is unique in its ability to perform multi-slice water/fat imaging of the same set of spatial slices; the other published multi-slice water/fat pulse sequences rely on the spatial misregistration of water and fat. One can even perform a combined multi-slice and multi-spectrum experiment, where one excites each desired spatial and spectral component in sequence.

There has been provided expressions for magnetization excited in the presence of oscillating gradients from which a spatial-spectral pulse for selective imaging is derived. The invention has been described with reference to water/fat imaging using sinusoidal waveforms, but the invention is applicable to other spatial-spectral selectivity and using waveforms other than sinusoidal.

Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A method of obtaining magnetic resonance signals from a body which are spatially and spectrally selective comprising the steps of
   (a) applying a static magnetic field (Bo) to said body thereby aligning nuclear spins,
   (b) applying a modulated magnetic gradient (G(t)) to said body, said modulated magnetic gradient having a modulation frequency, $\Omega$, which determines the frequency spacing of spectrally detected signals,
   said modulated magnetic gradient being applied for a period of time (T) sufficiently long so that the spectral transition band is narrower than the difference in frequencies of the responses of two spectral components,
   (c) applying an RF excitation pulse (B(t)) to said body to tip said nuclear spins, said RF excitation pulse being related to said modulation frequency, $\Omega$, and said period of time, T, whereby resulting magnetic resonance signals are spatially and spectrally dependent, and
   (d) detecting said magnetic resonance signals.

2. The method as defined by claim 1 wherein step (b) includes applying said modulated magnetic gradient (G(t)) where the gradient magnitude (G) is selected to achieve a desired spatial slice width from detected magnetic resonance signals.

3. The method as defined by claim 2 wherein said modulated magnetic gradient (G(t)) and said RF excitation pulse (B(t)) are given by the following expressions:

$$B_1(t) = B_1 e^{-\pi[\frac{\sin\Omega(t-T)}{U}]^2} e^{-\pi[\frac{t-(T/3)}{V}]^2} \cos\Omega(t - T)$$

$$G_z(t) = G \cos \Omega(t-T), \quad 0 \leq t \leq T.$$

where $\Omega$ is the gradient modulation frequency, and
U, V are constants.

4. The method as defined by claim 2 wherein said modulated magnetic gradient (G(t)) and said RF excitation pulse (B(t)) are given by the following expressions:

$$B_1(t) = B_1 sinc[C \sin \Omega(t-T)] sinc[D(t-T/2)] \cos \Omega(t-T)$$

$$G_z(t) = G \cos \Omega(t-T), \quad 0 \leq t \leq T.$$

where C, D are constants which define slice profile.

5. The method as defined by claim 1 wherein steps (b), (c) and (d) are repeated in a multi-slice or multi-spectral acquisition mode to obtain additional magnetic resonance signals which are spatially and spectrally dependent.

6. The method as defined by claim 1 wherein step (d) follows immediately after step (c).

7. Apparatus for obtaining magnetic resonance signals from a body which are spatially and spectrally selective comprising (a) means for applying a static magnetic field (Bo) to said body thereby aligning nuclear spins, (b) means for applying a modulated magnetic gradient (G(t)) to said body, said gradient having a modulation frequency, $\Omega$, which determines the frequency spacing of spectrally detected signals, said gradient being applied for a period of time (T) sufficiently long so that the spectral transition band is narrower than the difference in frequencies of the responses of two spectral components, (c) means for applying an RF excitation pulse (B(t)) to said body to tip said nuclear spins, said RF excitation pulse being related to said modulation frequency, $\Omega$, and said period of time, T, whereby resulting magnetic resonance signals are spatially and spectrally dependent, and (d) means for detecting said magnetic resonance signals.

8. Apparatus as defined in claim 7 wherein said means for applying a gradient applies a modulated magnetic gradient (G(t)) where the gradient magnitude (G) is selected to achieve a desired spatial slice width from detected magnetic resonance signals.

9. Apparatus as defined in claim 8 wherein said modulated magnetic gradient (G(t)) and said RF excitation pulse (B(t)) are given by the following expressions:

$$B_1(t) = B_1 e^{-\pi[\frac{\sin\Omega(t-T)}{U}]^2} e^{-\pi[\frac{t-(T/2)}{V}]^2} \cos\Omega(t - T)$$

$$G_z(t) = G \cos \Omega(t-T), 0 \leq t \leq T.$$

where $\Omega$ is the gradient modulation frequency, and
U, V are constants.

10. Apparatus as defined by claim 8 wherein said modulated magnetic gradient (G(t)) and said RF excitation pulse (B(t)) are given by the following expressions:

$$B_1(t) = B_1 sinc[C \sin \Omega(t-T)] sinc[D(t-T/2)] \cos \Omega(t-T)$$

$$G_z(t) = G \cos \Omega(t-T), \quad 0 \leq t \leq T.$$

where C, D are constants which define slice profile.

* * * * *